United States Patent
Zerilli et al.

Patent Number: 6,130,844
Date of Patent: Oct. 10, 2000

[54] LOW CONSUMPTION BOOSTED VOLTAGE DRIVING CIRCUIT

[75] Inventors: Tommaso Zerilli, Gravina di Catania; Maurizio Gaibotti, Cesano Maderno, both of Italy

[73] Assignee: STMicroelectronics S.r.l., Agrate Brianza, Italy

[21] Appl. No.: 09/257,682

[22] Filed: Feb. 26, 1999

[30] Foreign Application Priority Data

Feb. 27, 1998 [IT] Italy .................................. TO98A0165

[51] Int. Cl.$^7$ ...................................................... G11C 7/00
[52] U.S. Cl. .................................. 365/189.11; 365/230.06
[58] Field of Search .......................... 365/189.11, 189.09, 365/230.06, 185.23; 326/105, 106

[56] References Cited

U.S. PATENT DOCUMENTS

| | | | |
|---|---|---|---|
| 5,265,052 | 11/1993 | D'Arrigo et al. ................. | 365/189.09 |
| 5,606,530 | 2/1997 | Kiriaki ................. | 365/230.06 |
| 5,751,654 | 5/1998 | Pascucci ................. | 365/230.06 |
| 5,886,541 | 3/1999 | Asato ................. | 326/93 |

*Primary Examiner*—David Nelms
*Assistant Examiner*—David Lam
*Attorney, Agent, or Firm*—Theodore E. Galanthay; Stephen C. Bongini; Fleit, Kain, Gibbons, Gutman & Bongini P.L.

[57] ABSTRACT

A boosted voltage driving circuit includes an inverter circuit with positive feedback and a selective breaking circuit. The selective breaking circuit disconnects the positive feedback from the output load during an operation phase of the boosted voltage driving circuit in order to reduce energy consumption. In a preferred embodiment, the boosted voltage driving circuit is the final stage of a decoder circuit for selecting and deselecting a line or column of a memory array, and the positive feedback is disconnected during a deselection phase in which the line or column is deselected. The present invention also provides a boosted voltage driving circuit that includes first, second, and third transistors and a selective breaking circuit. The first transistor is connected between a supply voltage and an output node, the second transistor is connected between the output node and ground, and the third transistor is connected between the supply voltage and the gate of the first transistor. Further, the selective breaking circuit is connected between the output node and the gate of the third transistor to disconnect the gate of the third transistor from the output node during an operation phase of the boosted voltage driving circuit.

21 Claims, 4 Drawing Sheets

LOW CONSUMPTION BOOSTED VOLTAGE DRIVING CIRCUIT

CROSS-REFERENCE TO RELATED APPLICATIONS

This application is based upon and claims priority from prior Italian Patent Application No. TO-98-A000165, filed Feb. 27, 1998, the entire disclosure of which is herein incorporated by reference.

Additionally, this application is related to the applications "VOLTAGE BOOSTING CIRCUIT FOR GENERATING BOOSTED VOLTAGE PHASES" and "VOLTAGE PHASE GENERATOR WITH INCREASED DRIVING CAPACITY", which were filed on the same day as the present application and commonly assigned herewith to STMicroelectronics S.r.l. These related applications are herein incorporated by reference.

BACKGROUND OF THE INVENTION

1. Field of the Invention

The present invention relates to semiconductor memory devices, and more specifically to a low consumption boosted voltage driving circuit for a memory device.

2. Description of Related Art

In the last few years, memory development has been oriented to fulfilling technological requirements of portable devices such as personal computers, mobile telephones, and other devices with even smaller dimensions (e.g., "smart cards"). As a result, memory design has developed towards increasing cell array dimensions while simultaneously reducing energy consumption. A reduction in energy consumption is primarily obtained by decreasing the supply voltage and providing special circuits in the memory device to raise the operating voltage for those instances where it is required for specific functional reasons (e.g., compensation of voltage drops due to the threshold voltages of transistors controlling the memory cells and to ensure required switching speeds).

One such special circuit is a selection circuit for a word line or bit line of an integrated circuit memory device. The selection circuit has a final stage receiving a boosted voltage that is to be transferred to the line or word line selected by the line decoder, or to the gates of the selection transistors of the columns or bit lines selected by the column decoder. The final selection stage is driven by a logic signal from a digital circuit such as the decoder described above to supply an output signal having the level of the boosted voltage. Therefore, the final stage should have a special structure that is fast and congruent from a functional standpoint, such as is present in a typical inverter circuit.

FIGS. 1 and 2 show conventional driving circuits. The driving circuit 1 of FIG. 1 is a classic driving circuit, and the driving circuit 2 of FIG. 2 is a modified embodiment of the driving circuit 1 of FIG. 1. In the driving circuit 1 of FIG. 1, a NAND gate ND receives word line addresses L, M, and N. At the output of the gate ND, an insulating transistor M4 is provided such that its gate, which is maintained at the supply voltage VDD, separates the output of the gate ND from a node A that is connected to the gate of a P-channel MOS transistor M1. The source of the transistor M1 is connected to a boosted voltage VB. In order to express rated values, if the supply voltage VDD is 3.3 volts, the boosted voltage VB generated by boot-strap or internal generator techniques can be 5 volts (i.e., the boosted voltage is higher than the supply voltage VDD by at least the threshold voltage of a MOS transistor).

The drain of transistor M1 is connected to the drain of an N-channel MOS transistor M2 at a node B, and the gate of transistor M2 is connected to node A. As a result, the transistors M1 and M2 form a typical inverter that is supplied by the boosted voltage VB, with node B being the driving output for a word line WL. Further, another P-channel MOS transistor M3 has its gate connected to node B, its source connected to the boosted voltage VB, and its drain connected to node A. When inputs L, M, and N of the gate ND are all at "1" (i.e., for a selected word line), the boosted voltage VB is transferred to the driving output for the word line WL. In such an event, the gate ND output is at "0" and node A of the circuit 1 is discharged to "0". As a result, the transistor M1 is conductive and the transistor M2 is off. Under such conditions, the transistor M3 is also inhibited so as to not be in conflict with the NMOS transistors of the gate ND.

When deselecting the word line, the gate ND charges node A to a voltage equal to the supply voltage VDD less the threshold voltage VT of transistor M4. Thus, transistor M1 is partially off and transistor M2 is fully conducting. The capacity C associated with the word line then starts to discharge itself. During this phase, the transistor M3 begins to enter the conductive state to complete the charge of node A to the boosted voltage VB and fully inhibit transistor M1. The insulating transistor M4, which is preferably a natural transistor (i.e., a transistor with a lower threshold voltage), is used to separate the low voltage or logic portion from the high or boosted voltage portion of the circuit.

For the transistors dimensions, the following considerations apply. With Kp indicating the gain of a P-channel transistor in a hypothetical CMOS inverter that is supplied with the boosted voltage VB (which allows a certain preset selection time for the word line WL) and with Kn indicating the gain of an N-channel transistor in the same hypothetical inverter circuit (which allows a certain preset deselection time), in order to optimize switching time in the driving circuit 1, transistor M1 should have a gain of Kp and transistor M2 a gain of 7 Kn/3. Further, transistor M3 should have a gain of Kp/6 because it supplies the smallest current required for switching completion.

Accordingly, the driving circuit 1 of FIG. 1 can be seen as an inverter with added positive feedback to help completion of the switching process that is started by the low voltage logic. Like an inverter, such a circuit only shows consumption during switching. However, the demand for increasing the memory size has led to an increment in the capacitive loads exhibited by both the word lines and bit lines of an array. Thus, for speed reasons, both transistors M1 and M2 have to be sized according to W/L ratios (i.e., channel width to length ratios) on the order of hundreds. Thus, there is a higher dynamic current consumption, with the average current consumed by the boosted voltage VB at each read cycle being equal to the sum of two terms as shown in the following equation.

$$I = C(VB/T_{acc}) + I_{diss} \qquad (1)$$

With capacitive loads C on the order of picofarads and access times $T_{acc}$ on the order of 100 nanoseconds, the dissipative term $I_{diss}$ shows an amplitude comparable with that of the first term representing the most effective term. This entails at least two significant results: oversizing the booster circuit, with a consequent consumption of the silicon area; and an additional term of supply current consumption k by $I_{diss}$, where k is the booster efficiency. The driving circuit 2 of FIG. 2 is an improvement over the circuit of FIG.

1. In FIG. 2, the gate of transistor M2 is connected upstream of the insulation transistor M4, not downstream as in the circuit of FIG. 1. As a result, the cut-off of transistor M2 is faster during the deselection phase because it is directly driven by the output of the gate ND.

SUMMARY OF THE INVENTION

In view of these drawbacks, it is an object of the present invention to overcome the above-mentioned drawbacks and to provide a boosted voltage drive circuit that reduces the dissipative term while maintaining a constant switching time. The circuit uses positive feedback only when needed and disconnects the feedback from the load when it is not required.

One embodiment of the present invention provides a boosted voltage driving circuit that includes an inverter circuit with positive feedback and a selective breaking circuit. The selective breaking circuit disconnects the positive feedback from the output load during an operation phase of the boosted voltage driving circuit in order to reduce energy consumption. In a preferred embodiment, the boosted voltage driving circuit is the final stage of a decoder circuit for selecting and deselecting a line or column of a memory array, and the positive feedback is disconnected during a deselection phase in which the line or column is deselected.

Another embodiment of the present invention provides a boosted voltage driving circuit that includes first, second, and third transistors and a selective breaking circuit. The first transistor is connected between a supply voltage and an output node, the second transistor is connected between the output node and ground, and the third transistor is connected between the supply voltage and the gate of the first transistor. Further, the selective breaking circuit is connected between the output node and the gate of the third transistor to disconnect the gate of the third transistor from the output node during an operation phase of the boosted voltage driving circuit. In one preferred embodiment, the selective breaking circuit includes a fourth transistor that is connected between the gate of the third transistor and the output node, and a fifth transistor that is connected between the gate of the third transistor and ground.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention will be described in detail hereinbelow with reference to the attached drawings.

The present invention uses positive feedback only when needed (i.e., during the selection phase) and disconnects it from the load when not required (i.e., during the deselection phase). As shown in FIG. 3, the driving circuit 3 of a preferred embodiment of the present invention includes two transistors that are added to the drive circuit 2 of FIG. 2. In particular, a P-channel MOS transistor M6 and an N-channel MOS transistor M5 (preferably with a minimum size) are added. Transistor M5 is connected between the gate of transistor M3 and ground, and is driven by the gate ND. Further, transistor M6, which is also driven by the gate ND, is connected between the gate of transistor M3 and the output node B.

In operation, transistor M6 is used to separate node B, which is connected to the word line WL, from the gate of transistor M3 during the deselection phase. During this phase, transistor M1 has to be turned off quickly by transistor M3 to avoid having a cross-current between the boosted voltage VB and ground GND. This is accomplished through the pull-down action of transistor M5, which is directly connected to the gate of transistor M3, without having to wait for the discharge of node B (i.e., of the word line WL), which is rather slow due to the size of capacity C. A separation of the gate of transistor M3 and node B is imposed to eliminate the positive feedback. The required action is delegated to transistor M5, which is external to the feedback ring.

During the charge phase of the capacity C, the current consumed by the boosted voltage VB is practically represented by only the first term of equation (1) (i.e., main term), because during this phase the dissipative term $I_{diss}$ is irrelevant with transistor M2 being turned off before switching. In the preferred embodiment, the transistor sizes are as follows: M1 and M2 have gains Kp and Kn, M3 has gain Kp/12, M5 has gain Kn/6 (because it should discharge M3 fast enough), and M6 has gain Kp/12.

Figure 1:
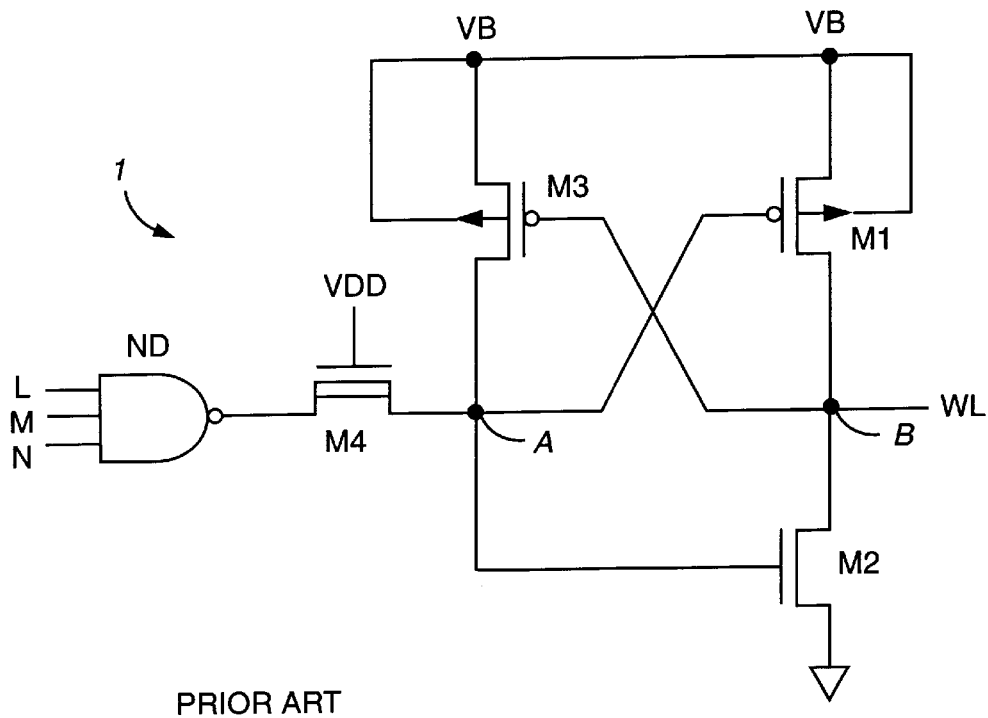
FIG. 1 shows a conventional driving circuit.
Figure 2:
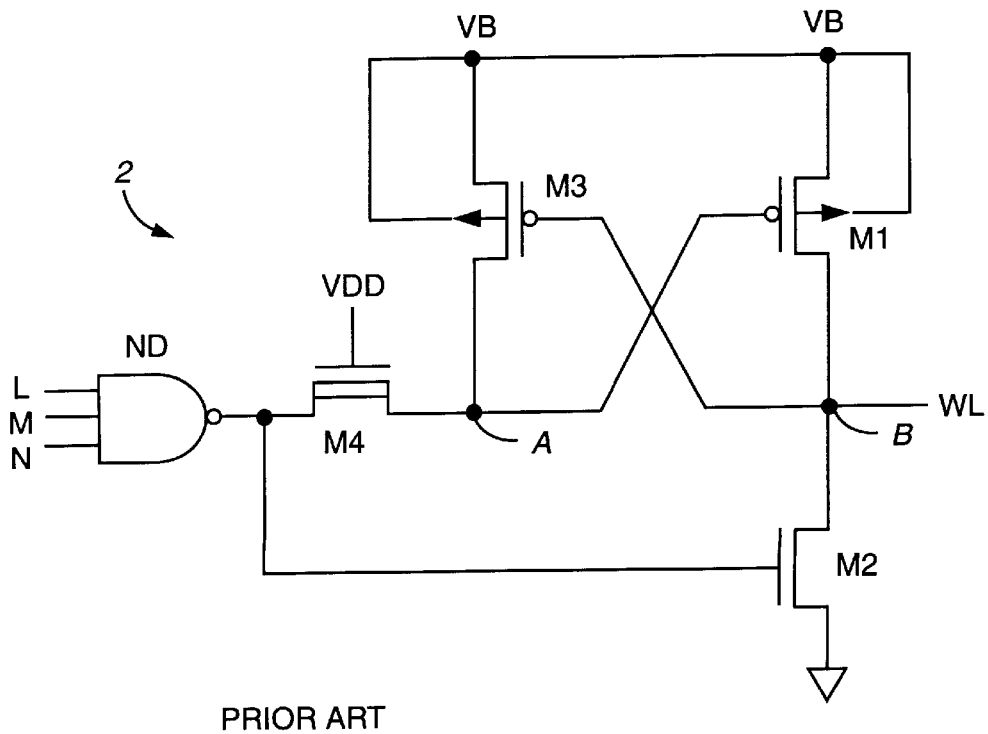
FIG. 2 shows another conventional driving circuit.
Figure 3:
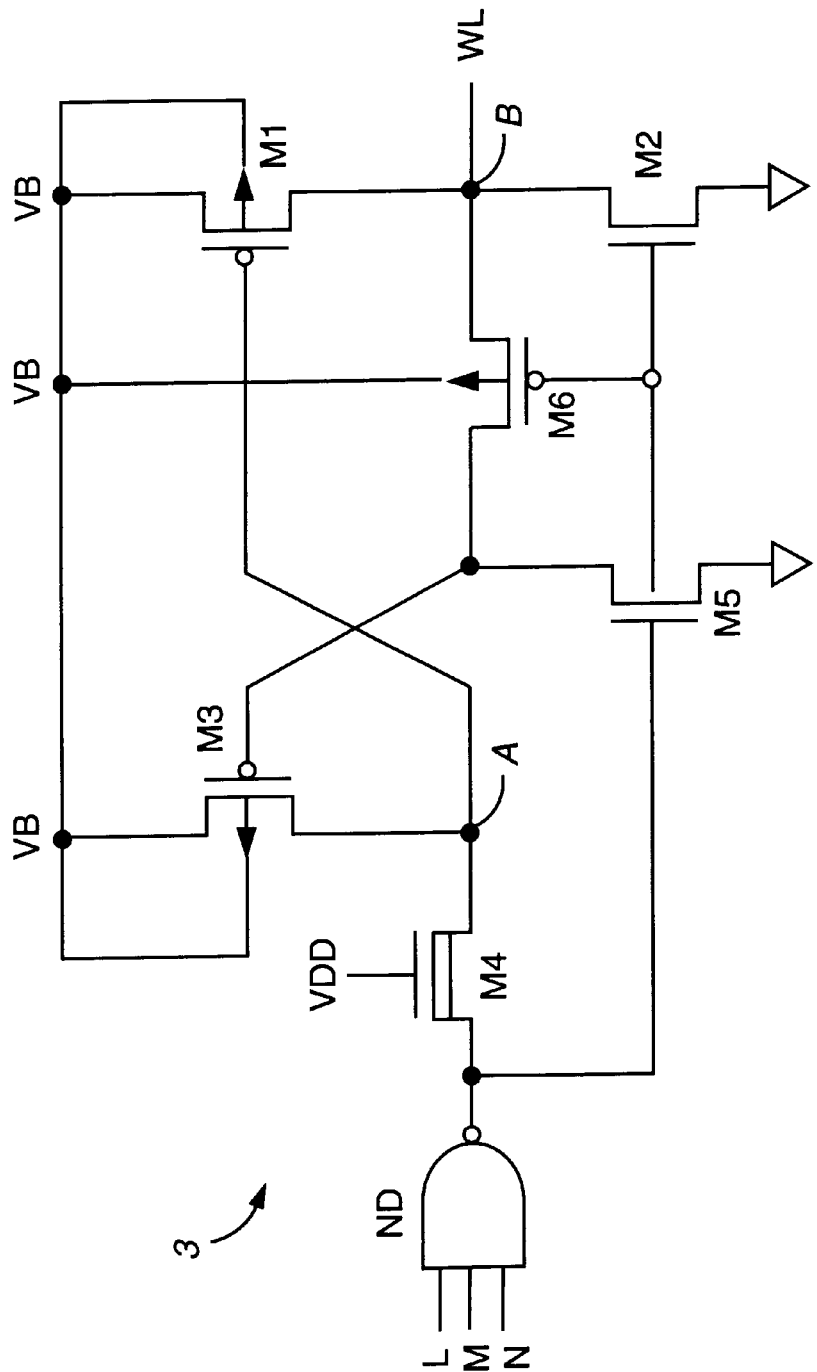
FIG. 3 shows a driving circuit according to a preferred embodiment of the present invention.
Figure 4:
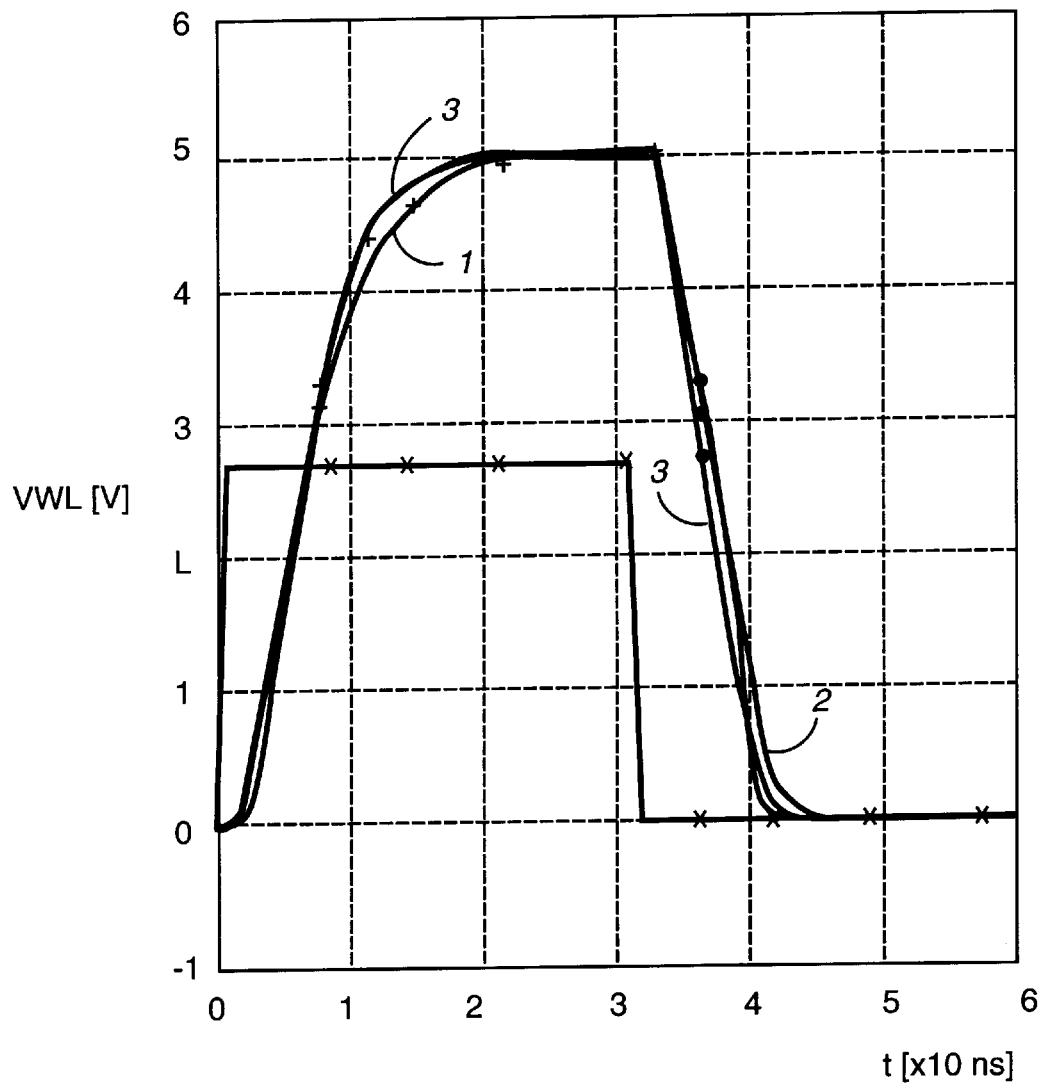
FIG. 4 shows a simulated trend of input and output voltages in the circuits of the previous figures.
Figure 5:
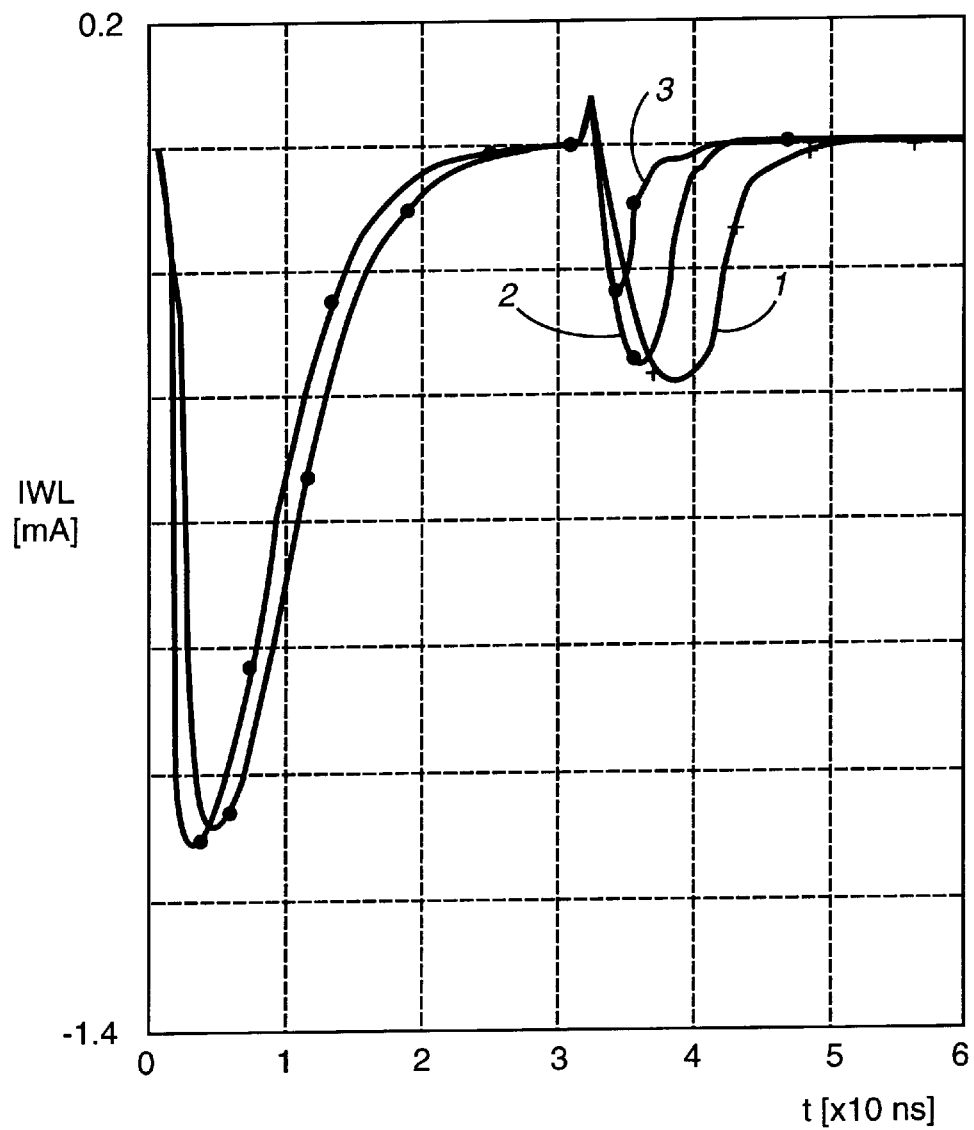
FIG. 5 shows a simulated trend of the current consumed by the boosted voltage in the circuits of the previous figures.

The operation of the circuits of FIGS. 1, 2, and 3 during a read cycle of a non-volatile memory has been simulated through computerized numerical elaboration, and the results are shown in FIGS. 4 and 5. FIG. 4 shows the voltage VWL trend on word line WL as a function of time, in response to a voltage step on one input L, M, or N of the gate ND. In particular, reference numerals 1 and 2 indicate the voltage curves related to driving circuits 1 and 2, and reference numeral 3 indicates the voltage curve related to the driving circuit 3 of the present invention. Curve 3 shows a faster selection time with lower energy consumption for the driving circuit of the present invention.

FIG. 5 shows the trends of the current consumed due to the boosted voltage IWL as a function of time. In the simulation, all circuits were size-optimized in terms of speed. In particular, the same sizes for the output transistor M1 were adopted, and the sizes of the other transistors were determined so as to have optimized switch time. Further, with regard to the driving circuit of FIG. 1, it was necessary to use a bigger size for the N-channel output transistor M2. Curves 1, 2, and 3 show the operation of the driving circuits 1, 2, and 3, respectively.

The consumed energy has been calculated as the integral of the consumed current during the whole switch cycle (selection and deselection). In FIG. 5, the current peak during the selection phase (0–30 ns) primarily represents the current required to charge the capacity C on the output node B, and the second peak, which is associated with the deselection phase, represents the dissipative term $I_{diss}$ (current consumed by the boosted voltage VB during the discharge phase of capacity C towards the ground). If the output transistor M1 ideally went into the off state instantaneously, this second peak would not exist.

As shown in FIG. 5, the dissipative term $I_{diss}$ during the deselection phase is clearly smaller with the driver circuit 3 of the present invention. Quantitatively, simulations and relevant calculations indicate that compared to theoretical consumption (i.e., the ideal circuit), there is a consumption surplus equal to:

60% for the driver circuit 1 of FIG. 1,

36% for the driver circuit 2 of FIG. 2, and

25% for the driver circuit 3 of FIG. 3.

Thus, the lower consumption in the driver circuit according to the present invention is quite consistent.

Accordingly, the present invention provides a boosted voltage drive circuit that reduces the dissipative term while maintaining a constant switching time by using positive feedback only when it is required. The low consumption boosted voltage driving circuit of the present invention is specially suited for use in non-volatile memory devices such as EPROM or EEPROM memories, especially in the final stage of a decoder circuit for the selection of a line (word line) or column (bit line) of the cell array in a low supply voltage memory device.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, other embodiments of the present invention may not include all of the features described above. Therefore, it is intended that the present invention not be limited to the particular embodiments disclosed, but that the invention include all embodiments falling within the scope of the appended claims.

What is claimed is:

1. A boosted voltage driving circuit comprising:

an inverter circuit with positive feedback; and a selective breaking circuit for disconnecting the positive feedback from an output load during an operation phase of the boosted voltage driving circuit in order to reduce energy consumption.

2. The boosted voltage driving circuit as defined in claim 1, wherein the boosted voltage driving circuit is a final stage of a decoder circuit for selecting and deselecting a line or column of a memory array, and the operation phase during which the positive feedback is disconnected is a deselection phase in which the line or column is deselected.

3. The boosted voltage driving circuit as defined in claim 2, wherein the selective breaking circuit includes a first transistor for disconnecting the positive feedback circuit during the deselection phase.

4. The boosted voltage driving circuit as defined in claim 3, wherein the selective breaking circuit further includes a second transistor that forms a discharge path during the deselection phase in order to provide faster switch-off of the boosted voltage driving circuit.

5. The boosted voltage driving circuit as defined in claim 4, wherein the first transistor is a P-channel MOS transistor and the second transistor is an N-channel MOS transistor.

6. The boosted voltage driving circuit as defined in claim 1, wherein the selective breaking circuit includes a first transistor for disconnecting the positive feedback circuit during the operation phase.

7. The boosted voltage driving circuit as defined in claim 6, wherein the selective breaking circuit further includes a second transistor that forms a discharge path during the operation phase.

8. The boosted voltage driving circuit as defined in claim 7, wherein the first transistor is a P-channel MOS transistor and the second transistor is an N-channel MOS transistor.

9. The boosted voltage driving circuit as defined in claim 1, wherein the boosted voltage driving circuit is integrated in a non-volatile memory device.

10. A memory device comprising:

a memory array having memory cells arranged in rows and columns;

word lines connected to the memory cells;

bit lines connected to the memory cells; and a decoder circuit for selecting and deselecting the word lines or bit lines, the decoder including a boosted voltage driving circuit having an output, wherein the boosted voltage driving circuit includes:

an inverter circuit with positive feedback; and a selective breaking circuit for disconnecting the positive feedback from the output during a deselection phase in which the word line or bit line is deselected in order to reduce energy consumption.

11. The memory device as defined in claim 10, wherein the selective breaking circuit includes a first transistor for disconnecting the positive feedback circuit during the deselection phase.

12. The memory device as defined in claim 11, wherein the selective breaking circuit further includes a second transistor that forms a discharge path during the deselection phase in order to provide faster switch-off of the boosted voltage driving circuit.

13. The memory device as defined in claim 12, wherein the first transistor is a P-channel MOS transistor and the second transistor is an N-channel MOS transistor.

14. The memory device as defined in claim 10, wherein the memory device is a non-volatile memory device.

15. A boosted voltage driving circuit comprising:

a first transistor connected between a supply voltage and an output node;

a second transistor connected between the output node and ground, the gate of the second transistor being connected to an input node;

a third transistor connected between the supply voltage and the gate of the first transistor; and a selective breaking circuit connected between the output node and the gate of the third transistor, the selective breaking circuit disconnecting the gate of the third transistor from the output node during an operation phase of the boosted voltage driving circuit in order to reduce energy consumption.

16. The boosted voltage driving circuit as defined in claim 15, wherein the selective breaking circuit includes a fourth transistor that is connected between the gate of the third transistor and the output node.

17. The boosted voltage driving circuit as defined in claim 16, wherein the selective breaking circuit further includes a fifth transistor that is connected between the gate of the third transistor and ground.

18. The boosted voltage driving circuit as defined in claim 17, wherein the fourth transistor is a P-channel MOS transistor and the fifth transistor is an N-channel MOS transistor.

19. The boosted voltage driving circuit as defined in claim 18, wherein the first and third transistors are P-channel MOS transistors and the second transistor is an N-channel MOS transistor.

20. The boosted voltage driving circuit as defined in claim 17, wherein the gate of the fourth transistor and the gate of the fifth transistor are connected to the gate of the second transistor.

21. The boosted voltage driving circuit as defined in claim 15, wherein the boosted voltage driving circuit is a final stage of a decoder circuit for selecting and deselecting a bit line or word line of a memory array, and the operation phase during which the gate of the third transistor is disconnected from the output node is a deselection phase in which the word line or bit line is deselected.

* * * * *

UNITED STATES PATENT AND TRADEMARK OFFICE
CERTIFICATE OF CORRECTION

PATENT NO : 6,130,844
DATED : October 10, 2000
INVENTOR(S): Tommaso ZERILLI et al.

It is certified that error appears in the above-identified patent and that said Letters Patent are hereby corrected as shown below:

On the title page: Item [30]
Under Foreign Application Priority Data, please change "TO98A0165" to --TO98A000165--.

Signed and Sealed this

Twenty-fourth Day of April, 2001

Attest:

NICHOLAS P. GODICI

Attesting Officer    Acting Director of the United States Patent and Trademark Office